(12) United States Patent
Sewell

(10) Patent No.: US 6,809,794 B1
(45) Date of Patent: Oct. 26, 2004

(54) IMMERSION PHOTOLITHOGRAPHY SYSTEM AND METHOD USING INVERTED WAFER-PROJECTION OPTICS INTERFACE

(75) Inventor: Harry Sewell, Ridgefield, CT (US)

(73) Assignee: ASML Holding N.V. (NL)

( * ) Notice: Subject to any disclaimer, the term of this patent is extended or adjusted under 35 U.S.C. 154(b) by 0 days.

(21) Appl. No.: 10/607,170

(22) Filed: Jun. 27, 2003

(51) Int. Cl.[7] .......................... G03B 27/52; G02B 21/02

(52) U.S. Cl. .......................... 355/30; 359/53; 359/656; 359/649

(58) Field of Search .................................. 359/649, 731, 359/727, 819, 832, 833, 656–661; 355/53, 77, 60, 43, 30; 250/548

(56) References Cited

U.S. PATENT DOCUMENTS

| 5,691,802 A | * | 11/1997 | Takahashi ..................... 355/53 |
| 5,715,039 A | * | 2/1998 | Fukuda et al. ................ 355/53 |
| 2002/0008862 A1 | * | 1/2002 | Kobayashi .................... 355/53 |

* cited by examiner

*Primary Examiner*—Georgia Epps
*Assistant Examiner*—M. Hasan
(74) *Attorney, Agent, or Firm*—Sterne, Kessler, Goldstein & Fox P.L.L.C.

(57) ABSTRACT

A liquid immersion photolithography system includes an exposure system that exposes a substrate with electromagnetic radiation, and also includes a projection optical system that focuses the electromagnetic radiation on the substrate. A liquid supply system provides a liquid between the projection optical system and the substrate. The projection optical system is positioned below the substrate.

42 Claims, 2 Drawing Sheets

IMMERSION PHOTOLITHOGRAPHY SYSTEM AND METHOD USING INVERTED WAFER-PROJECTION OPTICS INTERFACE

BACKGROUND OF THE INVENTION

1. Field of the Invention

The present invention relates to liquid immersion photolithography, and more particularly, to a method and system for confining liquid flow in an immersion photolithographic system.

2. Description of the Related Art

Optical lithography, using lens systems and catadioptric systems, is used extensively in the semiconductor manufacturing industry for the printing of circuit patterns. To date, the gap between a final lens element and a semiconductor wafer surface has been filled with gas, usually air or nitrogen. This gaseous gap works well particularly when the wafer is scanned under the optics during exposure and there is relative movement between the wafer and the lens system during the image transfer.

The practical limits of optical lithography assume that the medium through which imaging is occurring is air. This practical limit is defined by the equation $$\Lambda = \frac{\lambda}{4 \cdot n \cdot NA},$$

where $\lambda$ is the wavelength of incident light, NA is numerical aperture of the projection optical system, and n is the index of refraction of the medium (where 4 is used instead of 2 due to the use of off axis illumination). The gas interface between the final lens element and the wafer surface limits the maximum resolution of the optical system to a numerical aperture of <1.0. If the gas space between the final lens element and the wafer surface can be filled with a refractive material, such as oil or water, then the numerical aperture, and hence the resolution capability, of the system can be significantly increased, corresponding to the index of refraction n.

Thus, by introducing a liquid between a last lens element of the projection optical system and a wafer being imaged, the refractive index changes, thereby enabling enhanced resolution with a lower effective wavelength of the light source. Immersion lithography effectively lowers a 157 nm light source to a 115 nm wavelength (for example, for n=1.365), enabling the printing of critical layers with the same photolithographic tools that the industry is accustomed to using today.

Similarly, immersion lithography can push 193 nm lithography down to, for example, 145 nm (for n=1.33). 435 nm, 405 nm, 365 nm, 248 nm, 193 nm and 157 nm tools can all be used to achieve effectively better resolution and "extend" the usable wavelengths. Also, large amounts of $CaF_2$, hard pellicles, a nitrogen purge, etc.—can be avoided. Also, depth of focus can be increased by the use of liquid immersion, which may be useful, for example, for LCD panel manufacturing.

However, despite the promise of immersion photolithography, a number of problems remain, which have so far precluded commercialization of immersion photolithographic systems. One problem of existing immersion photolithographic systems involves the difficulties of confining the liquid that is used in an interface between the projection optical system and the wafer being exposed. In conventional systems, liquid is injected between the projection optical system and the wafer. Fairly complex systems have been proposed in order to maintain the confinement of the liquid.

An additional problem exists where the scanning motion of the wafer is such that the wafer is moved away from the exposure area, resulting in a spilling of the liquid. Such spillage is also a problem even when the wafer is present under the projection optical system due to the inherent viscosity properties of the liquid.

Accordingly, what is needed is a simple system and method for confining the liquid between the projection optical system and the wafer.

SUMMARY OF THE INVENTION

The present invention is directed to an immersion photolithography system and method using an inverted wafer-projection optics interface that substantially obviates one or more of the problems and disadvantages of the related art.

There is provided a liquid immersion photolithography system including an exposure system that exposes a substrate with electromagnetic radiation, and also includes a projection optical system that focuses the electromagnetic radiation on the substrate. A liquid supply system provides a liquid between the projection optical system and the substrate. The projection optical system is positioned below the substrate.

In another aspect there is provided a liquid immersion photolithography system that includes an exposure system that exposes a substrate with electromagnetic radiation, and also includes a projection optical system that focuses the electromagnetic radiation on the substrate A means for providing a liquid is between the projection optical system and the substrate. The projection optical system is positioned below the substrate. A meniscus is formed between the projection optical system and the wafer.

In another aspect there is provided a method of exposing a substrate including positioning a projection optical system below the substrate, projecting electromagnetic radiation onto the substrate using a projection optical system, and delivering a liquid between the projection optical system and the substrate.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGS.

The accompanying drawings, which are included to provide a further understanding of the exemplary embodiments of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

The present invention allows a space between a final lens element of a projection optical system and a wafer surface to be filled with a liquid. It allows a significant increase in the effective numerical aperture of the optical system. The volume of liquid is contained and held in position using a combination of pressure control on the liquid and gravity. The projection optical system (exposure system) is inverted compared to conventional systems currently in use. In other words, conventional systems expose downward or to the side, while the projection optical system of the present invention exposes upwards. The wafer is exposed with its resist-coated surface down, and the resist is in contact with a liquid meniscus. During wafer scanning, the meniscus traverses the resist-coated surface of the wafer.

The present invention allows the gap-filling liquid to be held in place even while the edge of the wafer is passed over the optics. The housing of the projection optical system, with the liquid, can be scanned off the edge of the wafer and rescanned onto the wafer while maintaining the liquid interface. Catch basins around the housing catch and contain any liquid displaced. The liquid meniscus is controlled by liquid pressure. This interface is thus easily compatible with many types of liquid.

Figure 1:
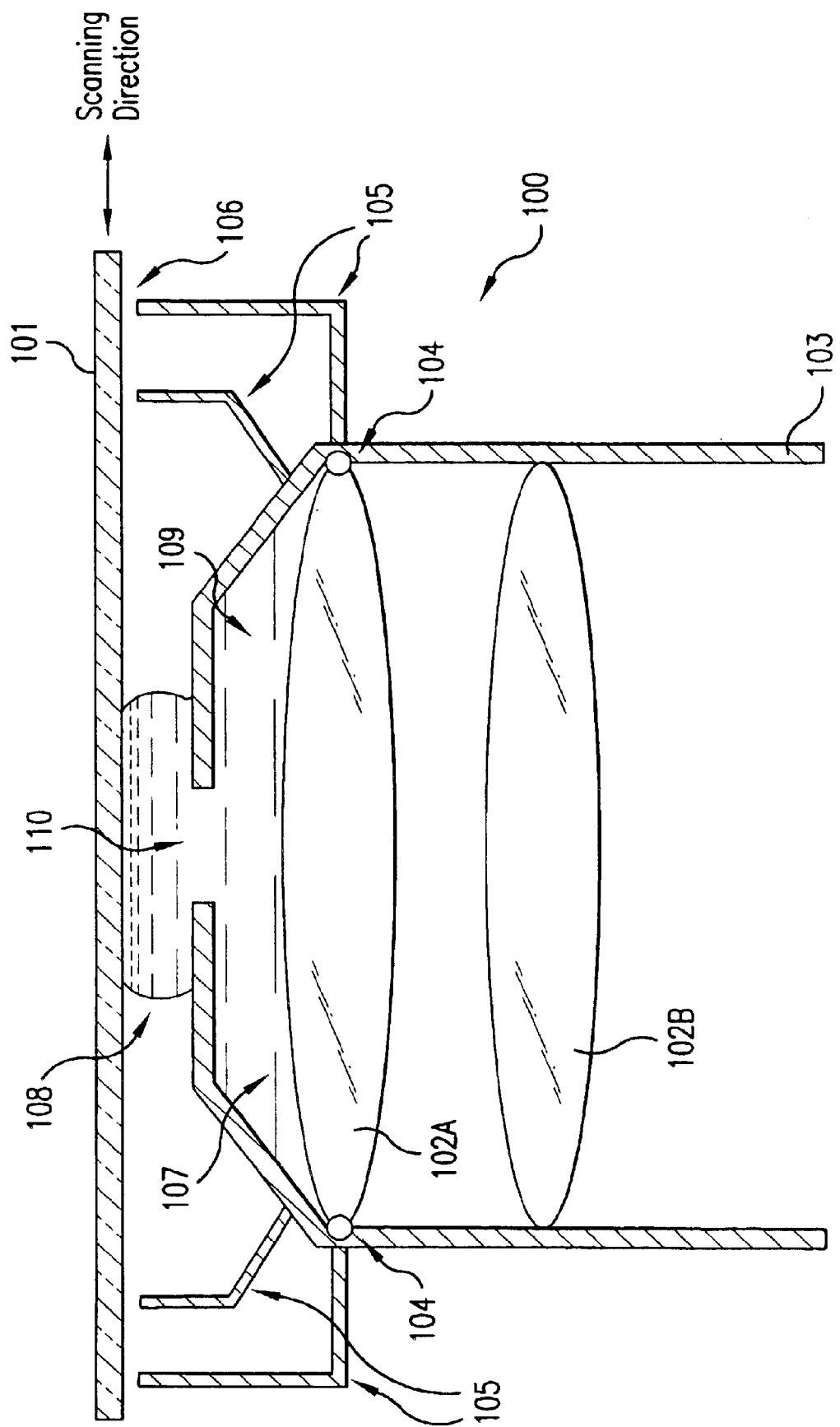
FIG. 1 shows a cross-sectional view of a liquid immersion photolithography system according to one embodiment of the present invention.

FIG. 1 illustrates an embodiment of a liquid immersion photolithographic system according to the present invention. As shown in FIG. 1, a projection optical system 100 is placed below a wafer 101. The wafer 101 includes resist-coated wafer surface 106. The projection optical system 100 includes a plurality of lens elements 102A, 102B, etc. The lens elements 102A, 102B are mounted within a housing 103. The top of the housing 103 includes an opening 110 for projecting an image onto the wafer 101. The top of the housing 103 is shown as horizontal in FIG. 1, although that need not necessarily be the case.

The region between the top of the housing 103 and the lens 102A (designated 107 in FIG. 1) is pressure controlled, and is sealed from the rest of the projection optics 100 by a liquid seal 104. The region 107 is filled with a liquid, normally under pressure from a liquid source (not shown in FIG. 1) so as to counterbalance the force of gravity. During exposure, the liquid forms a meniscus 108, as shown in FIG. 1. Catch basins 105 are used to remove any stray liquid, which may occur as the wafer 101 is scanned along a horizontal axis. It will be appreciated that more or fewer catch basins (compared to what is shown in FIG. 1) may be used. The catch basins 105 may also be annular around the housing 103.

Note that in the present invention, gravity is allowed to do the work of confining the liquid. The meniscus 108 is essentially controlled by gravity, while the wafer 101 is scanned. Furthermore, when the wafer 101 moves beyond the projection optics 100, the liquid will not readily spill over the edge of the wafer 101, unlike in conventional immersion photolithographic systems.

A liquid enclosing collar system (i.e., the catch basin 105) is attached to the end of the lithographic systems lens. As noted above, the projection optical system 100 exposes the image upwards onto the underside of the wafer 101 (i.e., wafer surface 106). The wafer 101 is resist coated, and the wafer surface 106 to be imaged is the lower surface. The top of the housing 103 provides a liquid interface between the final lens element 102A and the wafer surface 106 of the wafer 101 on which the projection optical system 100 is focused. The opening 110 in the top of the housing 103 allows the light beam from the projection optics 100 to be imaged on the wafer surface 106. It also allows intimate contact between the liquid and the wafer surface 106. It is important to ensure that the enclosed region 107 remains full of liquid, despite the top of the housing 103 being open to the wafer surface 106 and despite the wafer 101 potentially moving in an unrestricted manner above the projection optical system 100. The liquid is held in place by control of the pressure exerted on the liquid through a recirculation system (i.e., a liquid supply system, not shown in the figures). The pressure is controlled to balance gravity and maintain the meniscus 108 across the opening 110 when the wafer 101 is not present. When the wafer 101 is slid over the projection optical system 100, the pressure is increased to allow the liquid to "push out" of the aperture and contact the wafer surface 106. When the liquid interface slides over the edge of the wafer 101 due to the motion of the wafer 101 relative to the projection optics 100, the pressure on the liquid is adjusted to "pull back" the liquid from the wafer surface 106 into the region 107.

The top of the housing 103 near the aperture 110, shown in FIG. 1, may be specially contoured and surface finished to control the shape and properties of the interface liquid. For example, the surface of the top of the housing 103 may be made hydrophobic. The catch basins 105 surrounding the top of the housing 103 restrain the liquid that overflows or leaks from the top of the housing 103. This liquid can be filtered, temperature controlled and recycled back into the region 107.

Conditioning of the wafer surface 106 and the top of the housing 103 can further improve the performance. In the case of the liquid being water, the surfaces can be made hydrophobic. The gap (distance) between the wafer surface 106 and the top of the housing 103 is optimized by the dynamics of wafer exposure. While the system is designed for dynamic exposure of wafers in a scanning system, it also can be used in a step-and-scan type exposure system.

In typical dry exposure systems, the gap between the lens 102A and the wafer 101 is on the order of 3–4 millimeters. In the present invention, the dimension of the gap between the housing 103 and the wafer 101 may be made as low as 50 microns, although larger or smaller dimensions, for example, up to half a millimeter for the gap between the housing 103 and the wafer 101, may also be used (nominally, 100 microns are expected to be in the typical range, although ranges of 50–150 microns, 40–200 microns, or even up to 1 mm, and even in some cases greater than 1 mm, may be possible). It should be noted that water is the preferred liquid for 193 nanometer lithography, which is relatively lossless at 193 m. For 157 nanometer lithography, losses within the liquid are a concern, which tends to require smaller gaps between the lens 102A and the wafer 101. In other words, the lens 102A would move closer to the wafer 101 (down to about 1 mm or so). In the case of 157 nm lithography, the gap between the housing 103 and the wafer 101 may be down to 50 microns or less.

It will also be appreciated that in the present invention, the liquid may be removed completely, in the event that exposure of the wafer 101 calls for a dry exposure. For dry exposure, the optics needs to be adjusted accordingly (e.g., focus, spherical abberation, reduction in the numerical aperture, etc.)

As noted above, for 193 nm imaging, the liquid is preferably water (e.g., de-ionized water), although other liquids, for example, cyclo-octane, Krytox® (Foemblin oil) and perfluoropolyether fluids, may be used.

Figure 2:
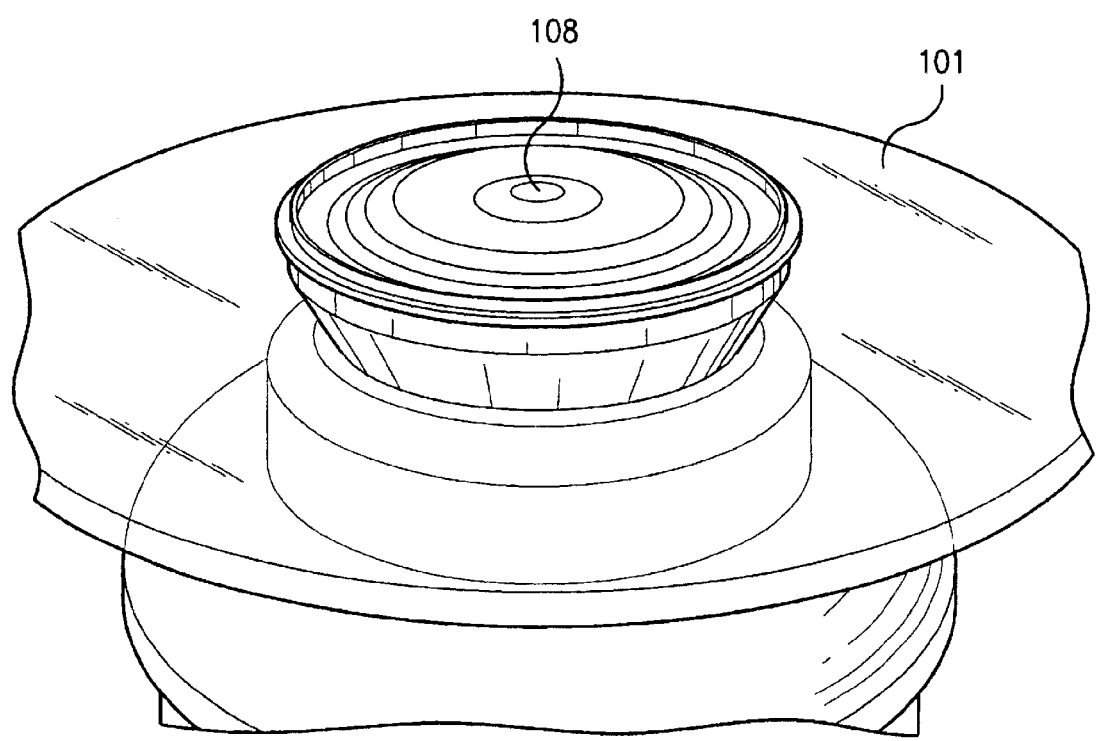
FIG. 2 shows an isometric view of the system of FIG. 1.

FIG. 2 illustrates an isometric view of the liquid immersion photolithographic system of FIG. 1. In FIG. 2, common elements with FIG. 1 have been labeled identically. (Note that in this simulated figure, the wafer 101 appears transparent)

Placing of the projection optical system 100 below the wafer 101, rather than above it, permits taking advantage of gravity to form a meniscus 108 such that the confinement of the liquid is substantially simplified. This removes the need for complicated confinement systems, fairly complex liquid recirculation and pumping mechanisms, etc. It also considerably simplifies the effects of any stray liquid that can be simply captured using the catch basins 105.

As an alternative, it is possible to have "fountainhead" effect, where the liquid is expelled from the housing 103 towards the wafer 101, achieving a similar effect as that of the meniscus, and then flows in the catch basins for recycling.

The present invention results in a number of benefits to a liquid immersion photolithographic system. Confinement of the liquid is simplified. Spillage is reduced or eliminated entirely. The system may be used both as a wet exposure system (with the liquid), and as a dry exposure system (without the liquid, with optics adjustes), as appropriate. All of these benefits allow the use of existing photolithographic tools and familiar wavelengths to define much smaller features on a semiconductor surface.

Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Also, the order of method steps may be rearranged. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A liquid immersion photolithography system comprising:
   an exposure system that exposes a substrate with electromagnetic radiation and includes a projection optical system that focuses the electromagnetic radiation on the substrate; and
   a liquid supply system that provides a liquid between the projection optical system and the substrate,
   wherein the projection optical system is positioned below the substrate.

2. The liquid immersion photolithography system of claim 1, wherein the liquid supply system is adapted to form a liquid meniscus above the projection optical system.

3. The liquid immersion photolithography system of claim 1, wherein the liquid supply system is adapted to form a fountainhead above the projection optical system.

4. The liquid immersion photolithography system of claim 1, wherein the projection optical system includes a housing with at least one catch basin positioned to capture stray liquid.

5. The liquid immersion photolithography system of claim 1, wherein the projection optical system includes:
   a housing in which a plurality of lenses are mounted, the housing including a pressure region between an uppermost lens of the plurality of lenses and a top of the housing;
   an opening in the top of the housing; and
   a liquid seal between an uppermost lens of the plurality of lenses and the pressure region.

6. The liquid immersion photolithography system of claim 5, wherein a distance between the substrate and the top of the housing is approximately 50–150 microns.

7. The liquid immersion photolithography system of claim 5, wherein a distance between the substrate and the top of the housing is between 50 microns and 500 microns.

8. The liquid immersion photolithography system of claim 5, wherein the top of the housing has a hydrophobic surface.

9. The liquid immersion photolithography system of claim 1, wherein the liquid supply system selectively provides the liquid only when wet exposure is needed.

10. The liquid immersion photolithography system of claim 1, wherein the electromagnetic radiation is 193 nanometers.

11. The liquid immersion photolithography system of claim 1, wherein the electromagnetic radiation is 157 nanometers.

12. The liquid immersion photolithography system of claim 1, wherein the electromagnetic radiation is 435 nanometers.

13. The liquid immersion photolithography system of claim 1, wherein the electromagnetic radiation is 405 nanometers.

14. The liquid immersion photolithography system of claim 1, wherein the electromagnetic radiation is 365 nanometers.

15. The liquid immersion photolithography system of claim 1, wherein the electromagnetic radiation is 248 nanometers.

16. A liquid immersion photolithography system comprising:
   an exposure system that exposes a substrate and includes a projection optical system; and
   means for providing a liquid between the projection optical system and the substrate,
   wherein the projection optical system is positioned below the substrate.

17. The liquid immersion photolithography system of claim 16, wherein the means for providing a liquid is adapted to form a liquid meniscus above the projection optical system.

18. The liquid immersion photolithography system of claim 16, wherein the means for providing a liquid is adapted to form a fountainhead above the projection optical system.

19. The liquid immersion photolithography system of claim 16, wherein the projection optical system includes a housing with at least one catch basin positioned to capture stray liquid.

20. The liquid immersion photolithography system of claim 16, wherein the projection optical system includes:

a housing in which a plurality of lenses are mounted, the housing including a pressure region between an uppermost lens of the plurality of lenses and a top of the housing;

an opening in the top of the housing; and a liquid seal between an uppermost lens of the plurality of lenses and the pressure region.

21. The liquid immersion photolithography system of claim 20, wherein a distance between the substrate and the top of the housing is approximately 50–150 microns.

22. The liquid immersion photolithography system of claim 20, wherein a distance between the substrate and the top of the housing is between 50 microns and 500 microns.

23. The liquid immersion photolithography system of claim 20, wherein the top of the housing has a hydrophobic surface.

24. The liquid immersion photolithography system of claim 16, wherein the means for providing a liquid selectively provides the liquid only when wet exposure is needed.

25. The liquid immersion photolithography system of claim 16, wherein the electromagnetic radiation is 193 nanometers.

26. The liquid immersion photolithography system of claim 16, wherein the electromagnetic radiation is 157 nanometers.

27. The liquid immersion photolithography system of claim 16, wherein the electromagnetic radiation is 435 nanometers.

28. The liquid immersion photolithography system of claim 16, wherein the electromagnetic radiation is 405 nanometers.

29. The liquid immersion photolithography system of claim 16, wherein the electromagnetic radiation is 365 nanometers.

30. The liquid immersion photolithography system of claim 16, wherein the electromagnetic radiation is 248 nanometers.

31. A liquid immersion photolithography system comprising:

an exposure system that includes a projection optical system; and a liquid supply system adapted for providing a liquid between the projection optical system and the substrate, wherein the projection optical system is adapted for positioning below the substrate.

32. A liquid immersion photolithography system comprising:

an exposure system that includes a projection optical system; and a liquid supply system adapted for providing a liquid between the projection optical system and the substrate, wherein the liquid supply system is adapted for forming a liquid meniscus above the projection optical system.

33. The liquid immersion photolithography system of claim 32, wherein the projection optical system is adapted for positioning below the substrate.

34. The liquid immersion photolithography system of claim 32, wherein the projection optical system includes a housing with at least one catch basin adapted to capture stray liquid.

35. The liquid immersion photolithography system of claim 32, wherein the projection optical system includes:

a housing in which a plurality of lenses are mounted, the housing including a pressure region between an uppermost lens of the plurality of lenses and a top of the housing;

an opening in the top of the housing; and a liquid seal between an uppermost lens of the plurality of lenses and the pressure region.

36. The liquid immersion photolithography system of claim 35, wherein the top of the housing has a hydrophobic surface.

37. The liquid immersion photolithography system of claim 35, wherein the liquid supply system is adapted to selectively provide the liquid only when wet exposure is needed.

38. An upwardly directed projection optical system comprising:

a housing including a hydrophobic upper portion and having an opening formed in the hydrophobic upper portion;

a catch basin around a periphery of the housing;

a plurality of lenses adapted for upward exposure of a substrate; and a liquid seal around a final lens element of the projection optical system.

39. A method of exposing a substrate comprising:

positioning a projection optical system below the substrate;

projecting electromagnetic radiation onto the substrate using a projection optical system; and delivering a liquid between the projection optical system and the substrate.

40. The method of claim 39, further comprising removing excess liquid from the substrate using at least one catch basin.

41. The method of claim 39, further comprising forming a liquid meniscus between the projection optical system and the substrate.

42. The method of claim 39, further comprising providing pressure to the liquid so as to maintain the meniscus.

* * * * *